United States Patent
Wu et al.

(10) Patent No.: US 8,288,193 B2
(45) Date of Patent: Oct. 16, 2012

(54) METHOD OF MANUFACTURING SELECTIVE EMITTER SOLAR CELL

(75) Inventors: Yung-Hsien Wu, Hsinchu (TW); Li-Karn Wang, Taipei (TW); Feng-Der Chin, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 324 days.

(21) Appl. No.: 12/706,192

(22) Filed: Feb. 16, 2010

(65) Prior Publication Data

US 2011/0081745 A1    Apr. 7, 2011

(51) Int. Cl.
*H01L 21/00* (2006.01)

(52) U.S. Cl. .................................. 438/69; 438/71

(58) Field of Classification Search ............. 438/69, 438/71, 549
See application file for complete search history.

(56) References Cited

U.S. PATENT DOCUMENTS 6,124,171 A * 9/2000 Arghavani et al. ............ 438/286
6,756,290 B1 * 6/2004 Bultman ........................ 438/549

* cited by examiner

*Primary Examiner* — Richard A. Booth
(74) *Attorney, Agent, or Firm* — JIPG PLLC

(57) ABSTRACT

The present disclosure uses ammonia plasma for nitrification and for further forming a barrier pattern on a substrate. Then, a selective emitter is fabricated by forming light doping and heavy doping at one time through diffusion into the substrate. Therein, a plurality of trenches for obtaining a front contact is formed at the same time on forming the barrier pattern. Thus, the fabrication process is simplified and the cost is reduced for fabricating a selective emitter solar cell.

27 Claims, 18 Drawing Sheets

METHOD OF MANUFACTURING SELECTIVE EMITTER SOLAR CELL

CROSS REFERENCE TO RELATED PATENT APPLICATIONS

This application claims priority from Taiwan Patent Application No. 098133699, filed in the Taiwan Patent Office on Oct. 5, 2009, entitled "Method of Manufacturing Selective Emitter Solar Cell," and incorporates the Taiwan patent application in its entirety by reference.

TECHNICAL FIELD

The present disclosure relates to obtaining a solar cell; more particularly, relates to fabricating a selective emitter solar cell.

DESCRIPTION OF THE RELATED ART

Many kinds of solar cells have been invented. Crystalline silicon solar cell is the most common owing to its good electro-optic conversion efficiency, its mature techniques compatible with those for semiconductor and its stable power output.

In FIG. 7, a general crystalline silicon solar cell 5 is shown, which comprises a substrate 51; a front contact 52 on top of the substrate 51; and a back contact 53 on bottom of the substrate 51. The substrate 51 is made of crystalline silicon and is homogeneously doped to form a p-n junction for outputting photocurrent under sunlight illumination through coordination of the front contact 52 and the back contact 53. Although technologies related to the crystalline silicon solar cells are maturely developed, the introduction of selective emitter has proven to be an effective way of enhancing the efficiency of the crystalline silicon solar cells.

In FIG. 8, a selective emitter solar cell 6 is shown, where the region for forming a front contact 62 on the substrate 61 is relatively heavily-doped to form a heavily-doped region 611 (which for example is n++ doped with a sheet resistance around 45~500 $\Omega$/sq with respect to the p-type substrate); and the region outside the front contact is relatively lightly-doped to form a lightly-doped region 612 (which for example is n+ doped with a sheet resistance around 110~1500 $\Omega$/sq with respect to the p-type substrate). Thus, a p-n junction is formed for outputting photocurrent under sunlight illumination with coordination of the front contact 62 and the back contact 63. Contrary to the crystalline silicon solar cell 5 which is usually homogeneously doped, the p-n junction thus fabricated above is enhanced with better short wavelength absorption, a lower leakage current and higher electro-optic conversion efficiency.

Methods for making a selective emitter solar cell through forming the heavily-doped and lightly-doped regions include the following:

1. A paste containing phosphorus is used to obtain a pattern of a coated layer through screen printing at region prepared for forming a front contact on a substrate. Then, the coated layer is used as a source for directly-diffusing and gas-phase out-diffusion phosphorus into the substrate. Thus, the region covered with the coated layer becomes a heavily-doped region by direct diffusion and the other region becomes a lightly-doped region through gas-phase out-diffusion. In this way, the heavily-doped region and the lightly-doped region are formed at one time. Yet, precise control of uniform diffusion is required for acquiring target doping concentrations. Hence, it is not fit for mass production.

2. A substrate is all highly doped to form a high-concentration doped layer. Then, a masking layer is formed through screen printing for an etching-back process to form a heavily-doped region and a lightly-doped region. The disadvantages are that it is difficult to etch back a large region for mass production; and that the textured surface may be harmed during etching back.

3. A pattern of masking layer made of silicon dioxide ($SiO_2$) is obtained on a substrate through screen printing before doping. Then, a dopant is doped into the substrate through diffusion. With the masking layer formed through screen printing, concentration and depth for doping are adjusted to form a heavily-doped region and a lightly-doped region. The biggest problem is that the compound of the masking layer may also be diffused into the substrate thus making the dopant concentration in the substrate obtained afterwards hard to be controlled.

4. Different concentrations of phosphor-silicate glass are put on required regions of a substrate to form a heavily-doped region and a lightly-doped region through a high temperature process. Such different concentrations can be obtained through changing the $SiH_4/PH_3$ ratio. The biggest obstacle is that a complex procedure is required to form phosphor-silicate glass having different concentrations on specified regions.

5. A substrate is all lightly doped to form a low-concentration doped layer. Then, a silver paste containing phosphorus is used to form a front contact through screen printing. At last, co-firing is processed to form the front contact while phosphorus diffuses into the low-concentration doped layer to form a heavily-doped region over the lightly-doped region. The advantage is that this method is compatible to common mass production techniques with the silver paste forming the front contact. However, silver would diffuse into the substrate faster than phosphorus on co-firing and thus a worsen leakage current may be obtained.

6. A substrate is all lightly doped to form a low-concentration doped layer. Then, the substrate is etched to produce trenches on region prepared for front contact, with the trench area being heavily-doped through a high-concentration doping. Afterwards, the trenches are processed through plating to form front buried contact. The advantage is that a selective emitter is fabricated with a front buried contact. Yet, this method is not compatible to common mass-production techniques owing to the required extra laser scribing, doping and plating facilities.

In addition, there is still a hidden key technique. The front contact has to be precisely positioned on the heavily-doped region for reducing series resistance and increasing fill factor, which are the true benefits gained from making the selective emitter. But, the front contact is usually formed through sintering after screen printing so that the positions and concentrations of the heavily-doped and lightly-doped regions are hard to be controlled, not to mention to precisely position the front contact on the heavily-doped region through screen printing with the silver paste.

Hence, the prior arts do not fulfill all users' requests for actual use.

SUMMARY OF THE DISCLOSURE

The main purpose of the present disclosure is to provide a method for fabricating a selective emitter solar cell, which is fit for mass production.

To achieve the above purpose, the present disclosure is a method of manufacturing a selective emitter solar cell, comprising steps of: (a) obtaining a barrier pattern made of silicon nitride on a top surface of a substrate to obtain an exposed region of the substrate; (b) doping a dopant from a dopant source into the substrate through the barrier pattern to obtain a lightly-doped region and a heavily-doped region, with the lightly-doped region having a doping type opposite to that of the substrate and formed at the region of the substrate outside the exposed region of the substrate; and with the heavily-doped region having a doping type opposite to that of the substrate and formed at the exposed region of the substrate not covered by the silicon nitride. Thus, the doping concentration of the heavily-doped region is larger than that of the lightly-doped region and is smaller than the solubility limit of the dopant in the substrate to obtain a p-n junction; (c) removing the barrier pattern; and (d) forming a front contact electrically connected to the substrate at the heavily-doped region and a back contact electrically connected to the substrate at the bottom surface of the substrate. Thus, a photocurrent is outputted through coordination of the front contact and the back contact when the top surface of the solar cell is illuminated by light. Accordingly, a novel method of manufacturing a selective emitter solar cell is obtained.

BRIEF DESCRIPTION OF THE DRAWINGS

The present disclosure will be better understood from the following detailed descriptions of the preferred embodiments according to the present disclosure, taken in conjunction with the accompanying drawings.

DESCRIPTION OF THE PREFERRED EMBODIMENTS

The following descriptions of the preferred embodiments are provided for understanding the features and the structures of the present disclosure.

Figure 1A:
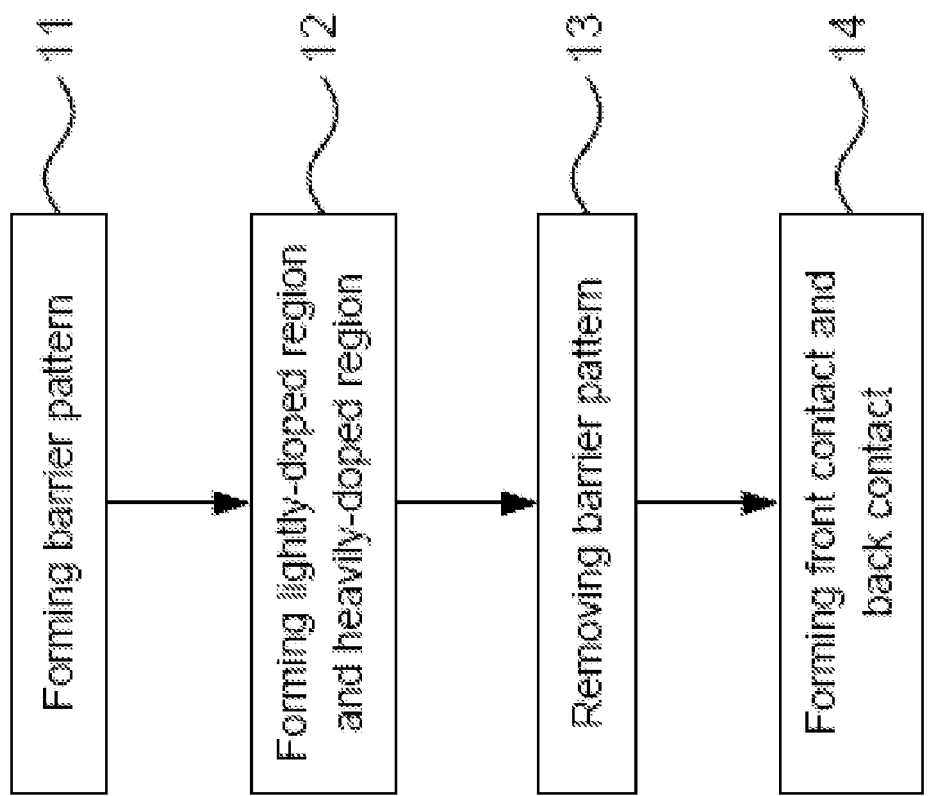
FIG. 1A to FIG. 1F are the views showing the flow and the states of use of the first preferred embodiment according to the present disclosure.
Figure 1B:
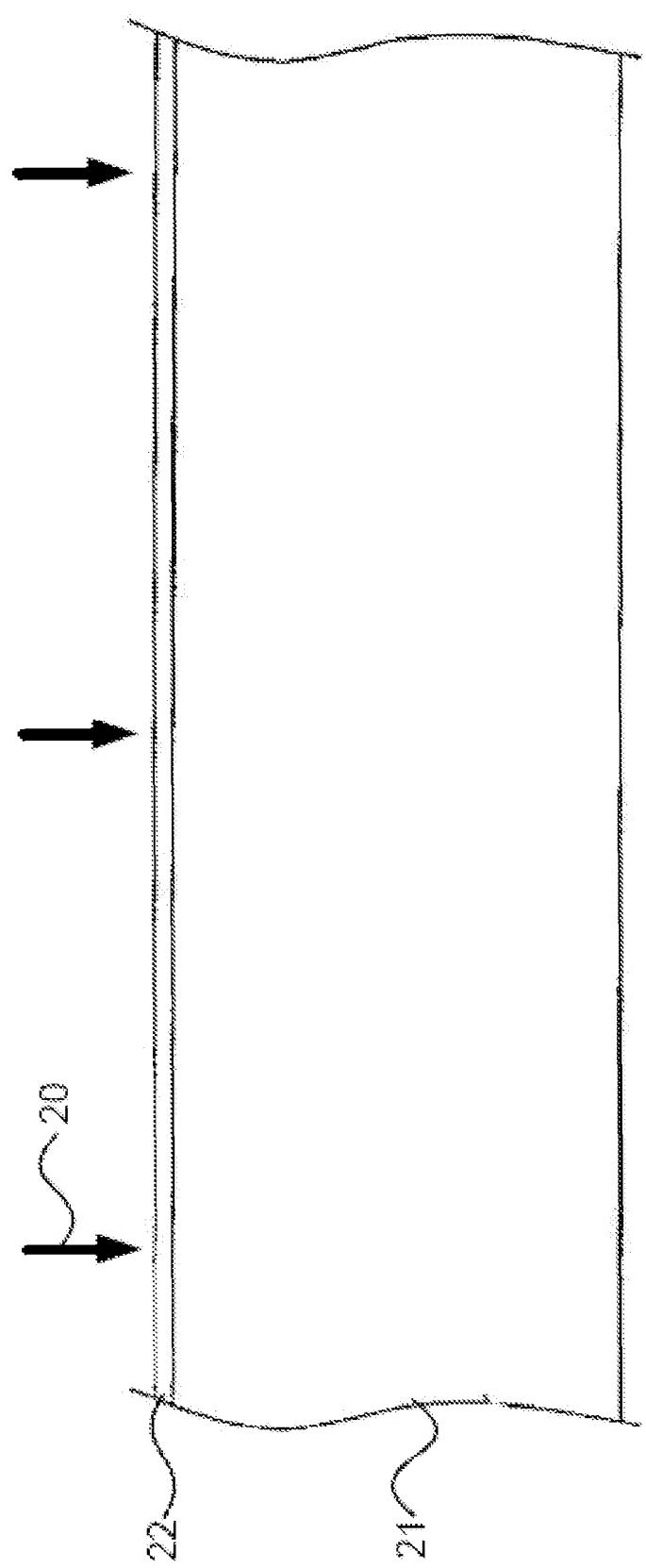
Figure 1C:
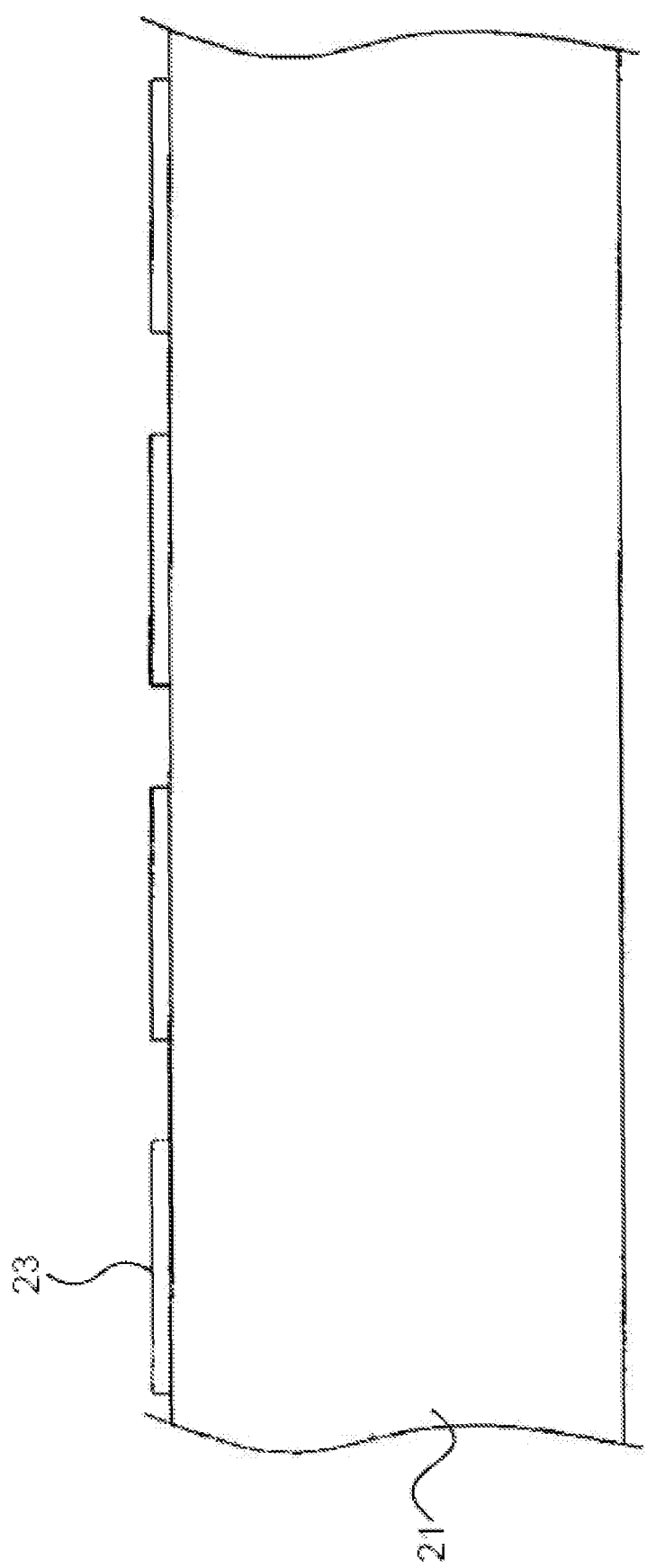

Please refer to FIG. 1A to FIG. 1F and FIG. 2 to FIG. 5, which are views showing a flow and states of use of a first preferred embodiment according to the present disclosure; a view showing a relationship among processing power, processing time, and thickness of a grown silicon nitride layer; a view showing refractive index of a grown silicon nitride layer; a view showing a relationship among processing power, processing time, and sheet resistance of a doped region; and a view showing a SIMS analysis of distribution of phosphorus atoms. As shown in these figures, the present disclosure is a method of manufacturing a selective emitter solar cell. In FIG. 1A, a first preferred embodiment according to the present disclosure comprises the following steps:

(a) Forming barrier pattern 11: In FIG. 1B and FIG. 1C, a barrier pattern 23 is formed on a top surface of a substrate 21, where the barrier pattern 23 is made of silicon nitride to obtain an exposed region. The substrate 21 contains silicon. At first, a silicon nitride layer 22 is formed on the top surface of the substrate 21 through nitrification. Then, the silicon nitride layer 22 is patterned to form the barrier pattern 23. Therein, the substrate 21 is a doped silicon wafer; the top surface of the substrate is nitrified to obtain the silicon nitride layer 22 through the use of ammonia plasma 20; the silicon nitride layer 22 is made of $SiN_x$ with $0.2 \leq x \leq 5.0$ and is not thicker than 12 nanometers (nm); and, the silicon nitride layer 22 is patterned to form the barrier pattern 23 through screen printing with a paste.

In another process for fabricating the barrier pattern 23 on a substrate 21 containing silicon, a mask layer different from silicon nitride is first coated on the top surface of the substrate 21 and then patterned to form the exposed region; through ammonia-plasma nitrification, silicon nitride is formed on the exposed region of the substrate 21. After the mask layer pattern is removed, there leaves a barrier pattern 23 made of silicon nitride on the substrate 21. The barrier pattern 23 made of silicon nitride can also be formed on the substrate 21 through chemical vapor deposition, sputtering, evaporating or chemical wet process.

Figure 1D:
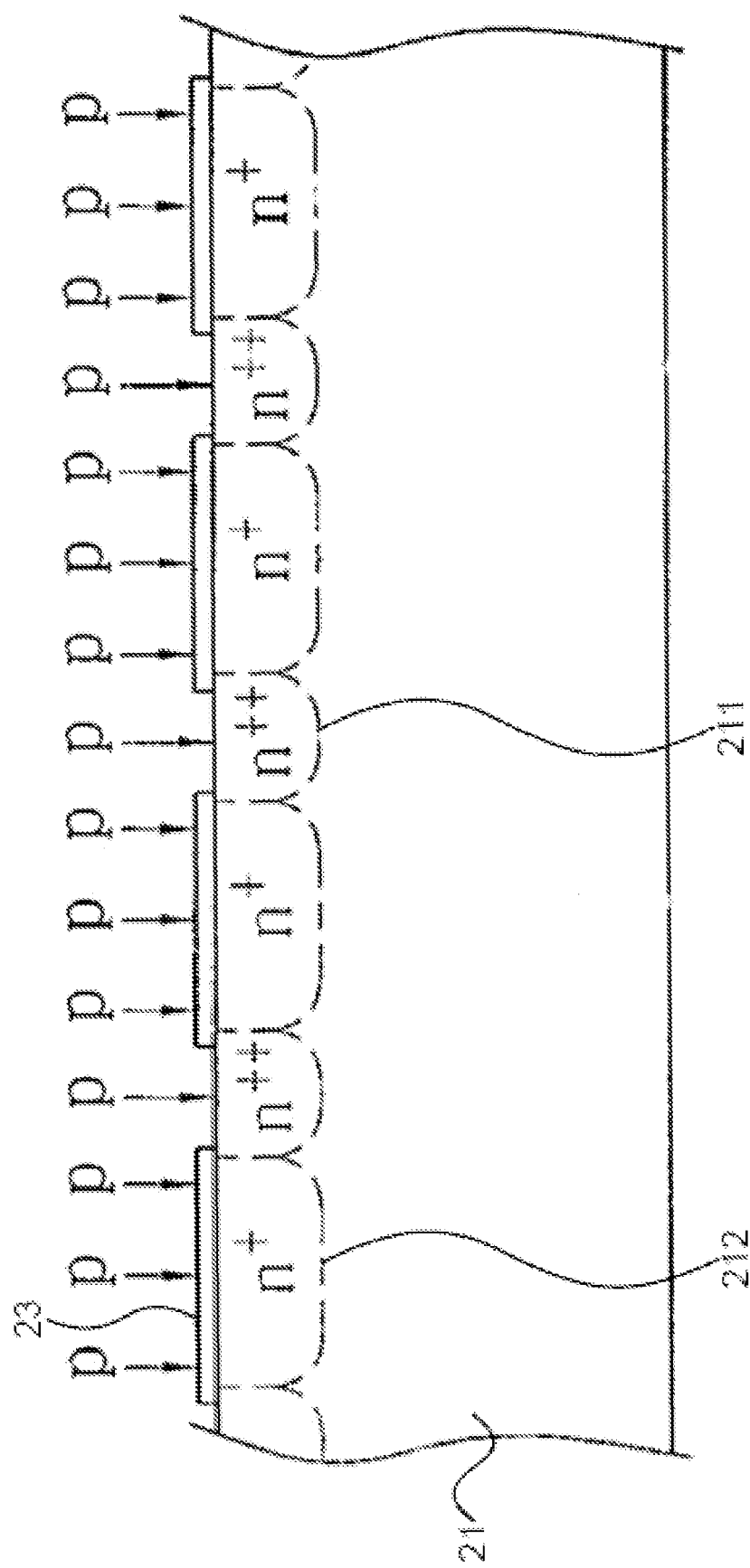

(b) Forming lightly-doped region and heavily-doped region 12: Take an example of p-type silicon substrate. In FIG. 1D, a dopant is doped from a dopant source into the substrate 21 through the barrier pattern 23 to obtain a lightly-doped region 212 and a heavily-doped region 211, with the lightly-doped region 212 having an n+ doping type and the heavily-doped region 211 having an n++ doping type. Both doping types are opposite to that of the substrate 21. The lightly-doped region 212 is formed at the region outside the exposed region of the substrate 21, i.e., the region covered by the silicon nitride, while the heavily-doped region 211 is formed at the exposed region of the substrate 21, i.e., the region not covered by the silicon nitride. Therein, a doping concentration of the heavily-doped region 211 is larger than that of the lightly-doped region 212 and smaller than the solubility limit of the dopant in the substrate 21 in forming a p-n junction. The lightly-doped region 212 and the heavily-doped region 211 can be formed through solid doping or vapor doping. For example, $POCl_3$ and $O_2$ can react to obtain $P_2O_5$ as a dopant source for forming the lightly-doped and the heavily-doped regions 212, 211 by doping phosphorus into the substrate 21, where operating temperature for diffusion into a p-type substrate is between 700° C. and 1050° C.

With different levels of nitrification, thickness and nitrogen content of the silicon nitride layer 22 are controlled. When the dopant is doped through diffusion into the substrate, the doping concentration is controlled by the silicon nitride layer 22. The dopant is an element selected from VA group, like phosphorus (P), arsenic (As) or antimony (Sb), or its compound. When the silicon nitride layer 22 is thicker or the silicon nitride layer 22 has higher nitrogen content, the diffusion of the dopant is more effectively restrained. When the doping concentration is lower, a higher sheet resistance is obtained. Besides, the substrate 21 can be an n-type silicon wafer; and the dopant can be an element selected from IIIA group, like boron (B), aluminum (Al), gallium (Ga), indium (In) or thallium (Tl), or its compound. In this case, the operating temperature for diffusion into the substrate is between 650° C. and 1050° C.

Figure 1E:
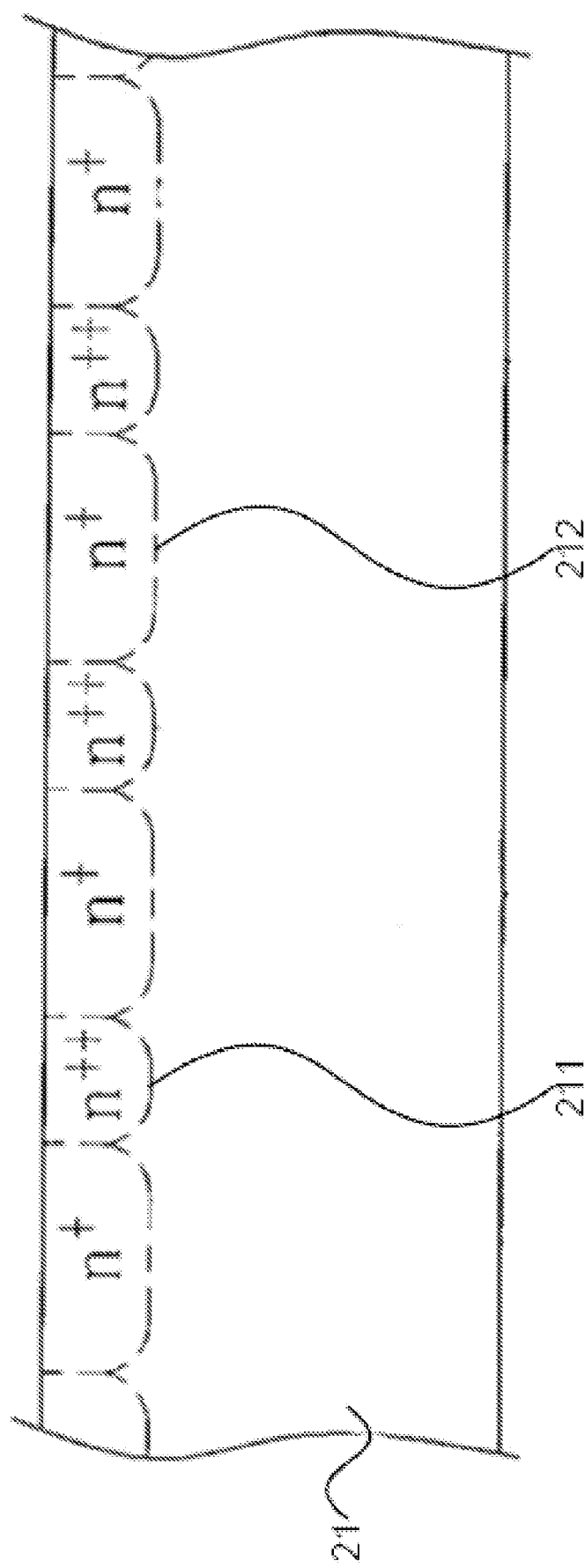
Figure 1F:
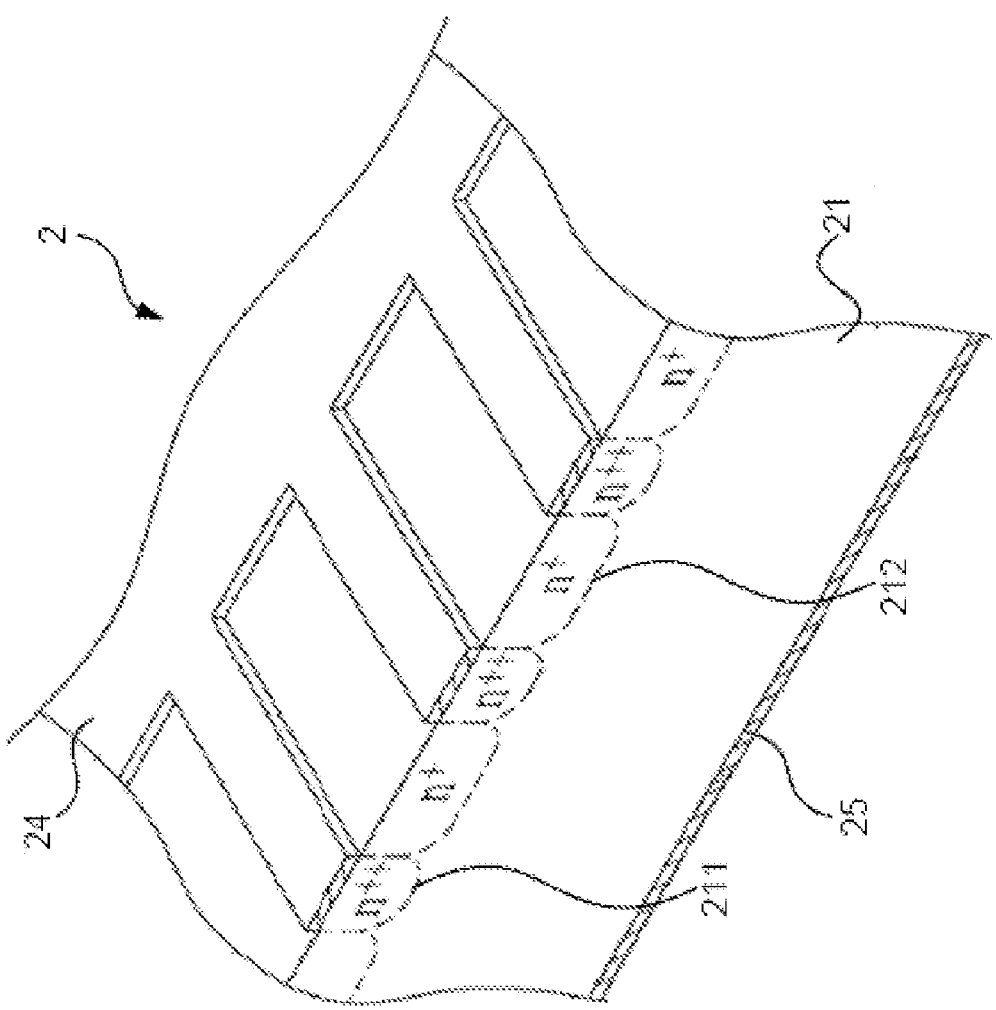

(c) Removing barrier pattern 13: In FIG. 1E, the present disclosure would select an etchant which is able to remove the barrier pattern 23 and the dopant source at the same time but is not able to etch the substrate 21. Therein, the etchant can be HF, BOE and the like for etching $P_2O_5$ and silicon nitride at the same time but not hurting crystalline silicon. Thus, both the barrier pattern 23 and the dopant source (i.e. P2O5) are removed for simplifying the fabrication process.

(d) Forming front contact and back contact 14: At last, in FIG. 1F, a front contact 24 electrically connected to the substrate 21 is formed at the heavily-doped region 211; and a back contact 25 electrically connected to the substrate 21 is formed at a bottom surface of the substrate 21. Thus, a selective emitter solar cell 2 is fabricated.

As is described above, the present disclosure nitrifies the silicon-contained substrate 21 with ammonia plasma to form the silicon nitride layer 22 and further form the barrier pattern 23; and, then, the dopant is diffused to form the lightly-doped region 212 and the heavily-doped region 211 through concentration control with coordination of the barrier pattern 23. Thus, the selective emitter solar cell 2 is fabricated through a simple process.

Figure 2:
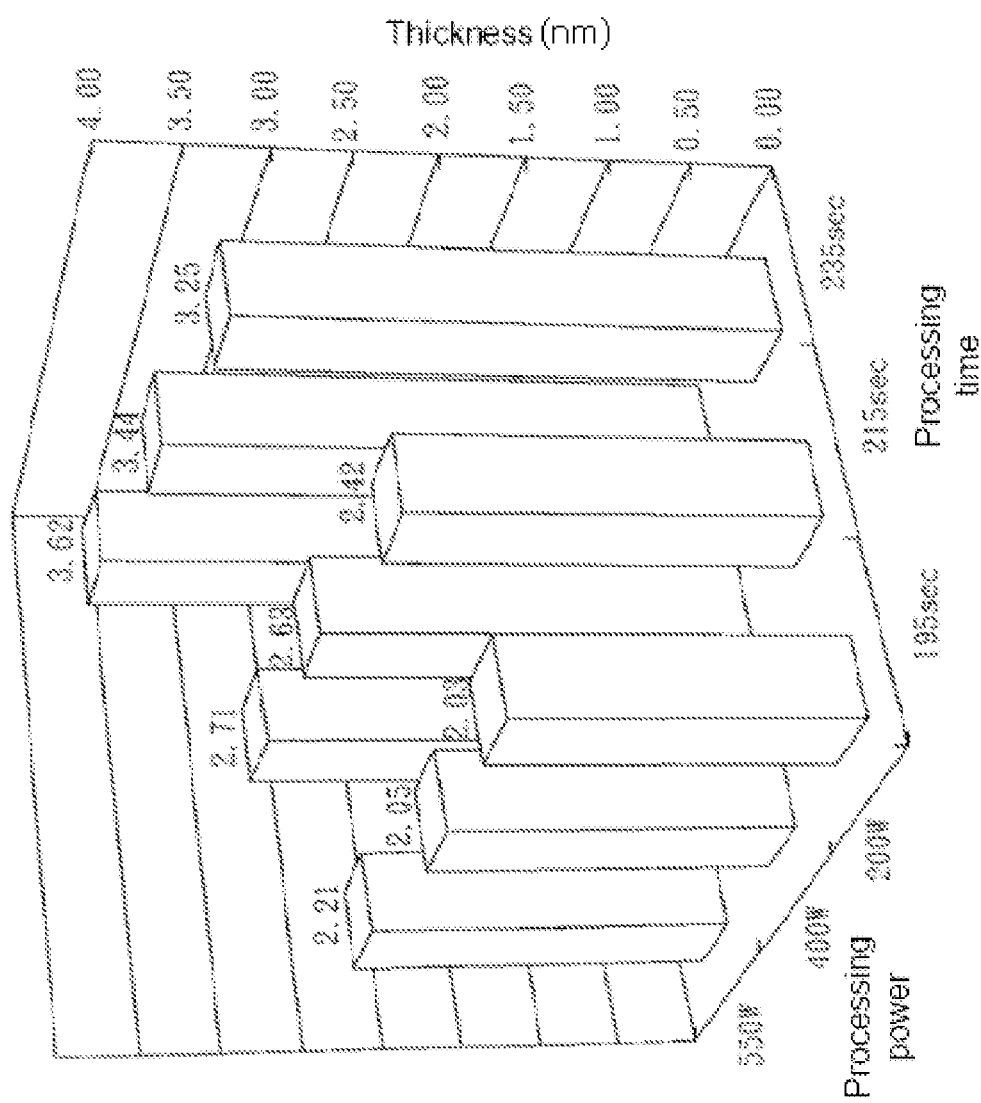
FIG. 2 is the view showing the relationship among processing power, processing time, and thickness of a grown silicon nitride layer.

In FIG. 2, when the silicon nitride layer 22 is grown by nitrifying the substrate 21 with ammonia plasma, thickness and composition of the silicon nitride layer 22 are determined by RF power and nitrification time. That is to say, when RF power is larger or the nitrification time is longer, the silicon nitride layer 22 is thicker. A 215-second nitrification is taken as an example. When RF power is increased from 200 W to 400 W and even 500 W, the refractive index of the silicon nitride layer 22 is changed from 2.19 to 2.11 and 1.99. It shows that, with a smaller RF power, the formed silicon nitride layer 22 has less nitrogen (Si-rich); on the contrary, with an increased RF power, the formed silicon nitride layer contains more nitrogen owing to decomposition of more nitrogen atoms.

Figure 3:
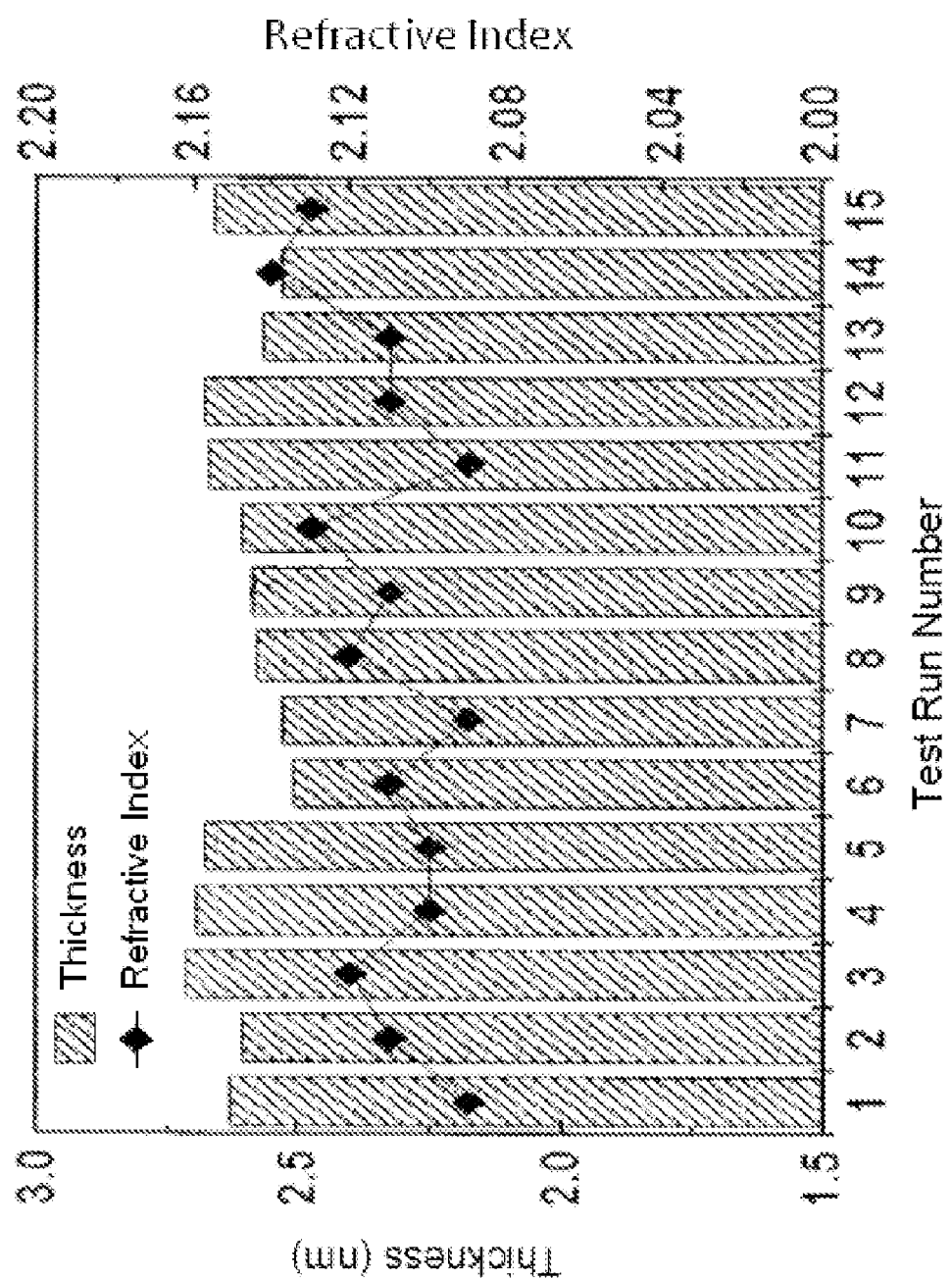
FIG. 3 is the view showing the thicknesses and refractive indices of grown silicon nitride layers.

In FIG. 3, when RF power is 400 W and nitrification time is 215 seconds, thickness and refractive index of the formed silicon nitride layer 22 has a good uniformity over multiple test runs. Hence, the present disclosure is suitable for mass production.

Figure 4:
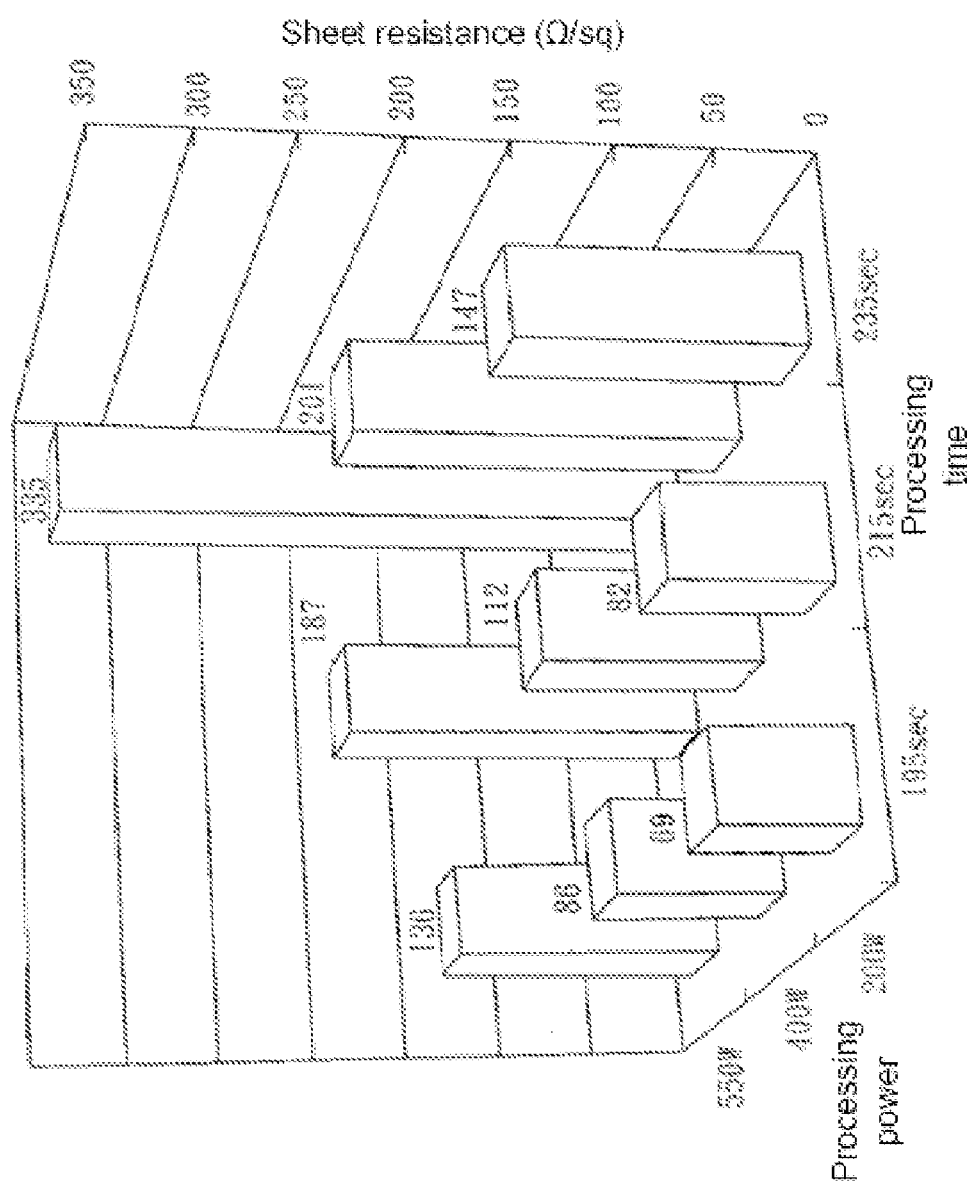
FIG. 4 is the view showing the relationship among processing power, processing time, and the sheet resistance of a doped region.

In FIG. 4, a silicon nitride layer 22 with larger thickness or more nitrogen content will restrain diffusion of phosphorus atoms into the substrate 21 resulting in a lightly-doped region 212 and henceforth a higher sheet resistance. Hence, 112 Ω/sq obtained under 400 W RF power and 215-second nitrification time is suitable for forming a lightly-doped region 212 having a high sheet resistance (low doping).

Figure 5:
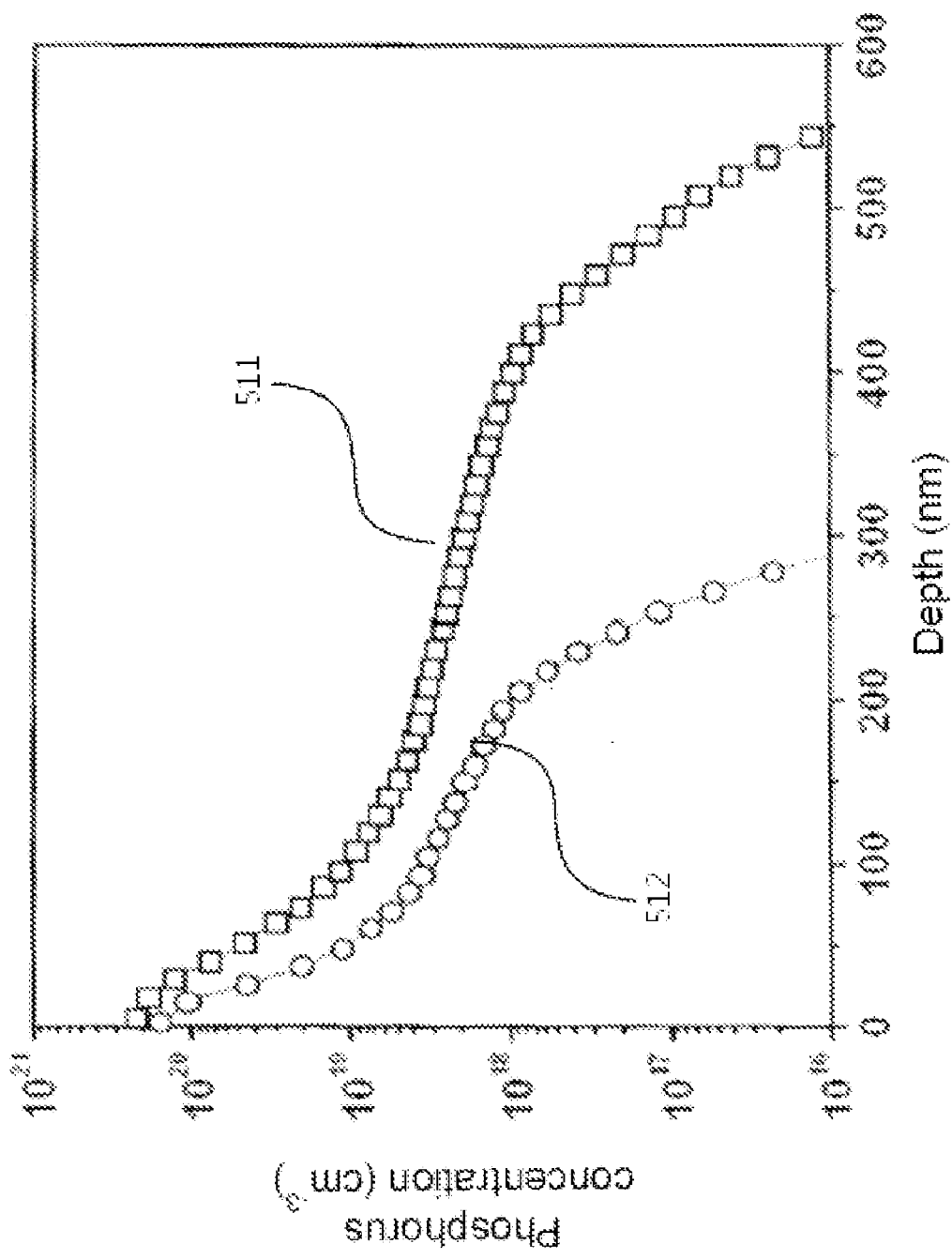
FIG. 5 is the view showing the SIMS analysis of the distribution of phosphorus atoms.

In FIG. 5, the heavily-doped region 211 having a low sheet resistance (45 Ω/sq) according to the present disclosure has a phosphorus concentration distribution 511 with the concentration $2.1 \times 10^{20}$ cm$^{-3}$ at the surface and a p-n junction depth of 0.482 μm. Regarding the lightly-doped region 212 having a high sheet resistance (112 Ω/sq), the phosphorus concentration distribution 512 has a maximum at $1.2 \times 10^{20}$ cm$^{-3}$ and a p-n junction depth of 0.254 μm.

Figure 6A:
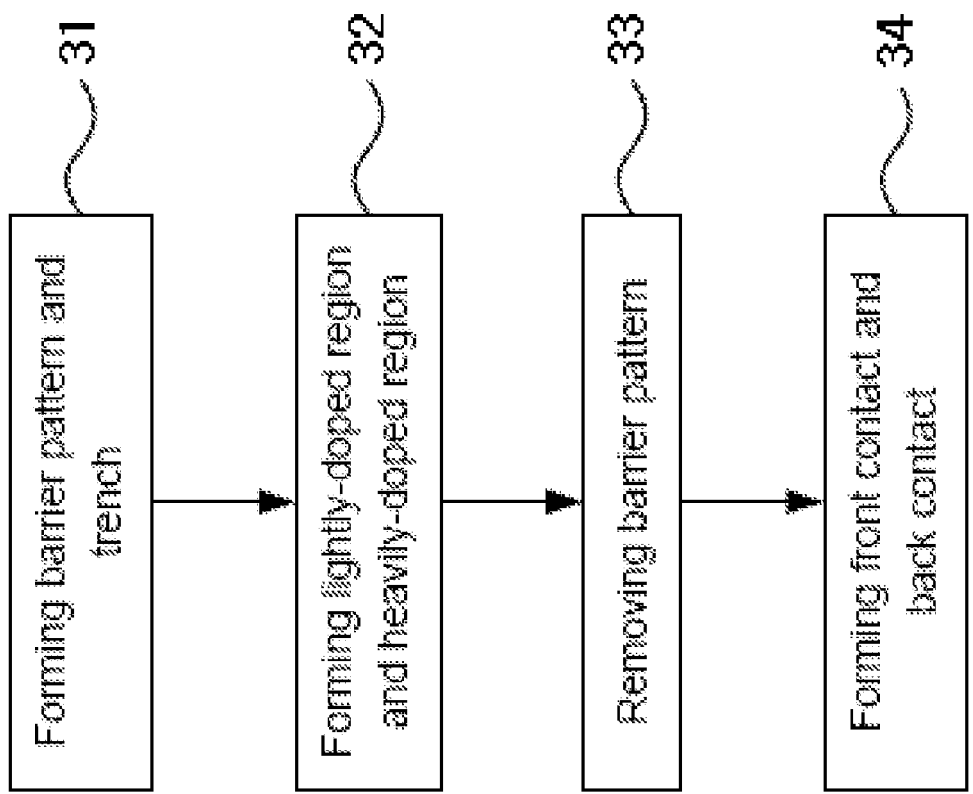
FIG. 6A to FIG. 6F are the views showing the flow and the states of use of the second preferred embodiment.
Figure 6B:
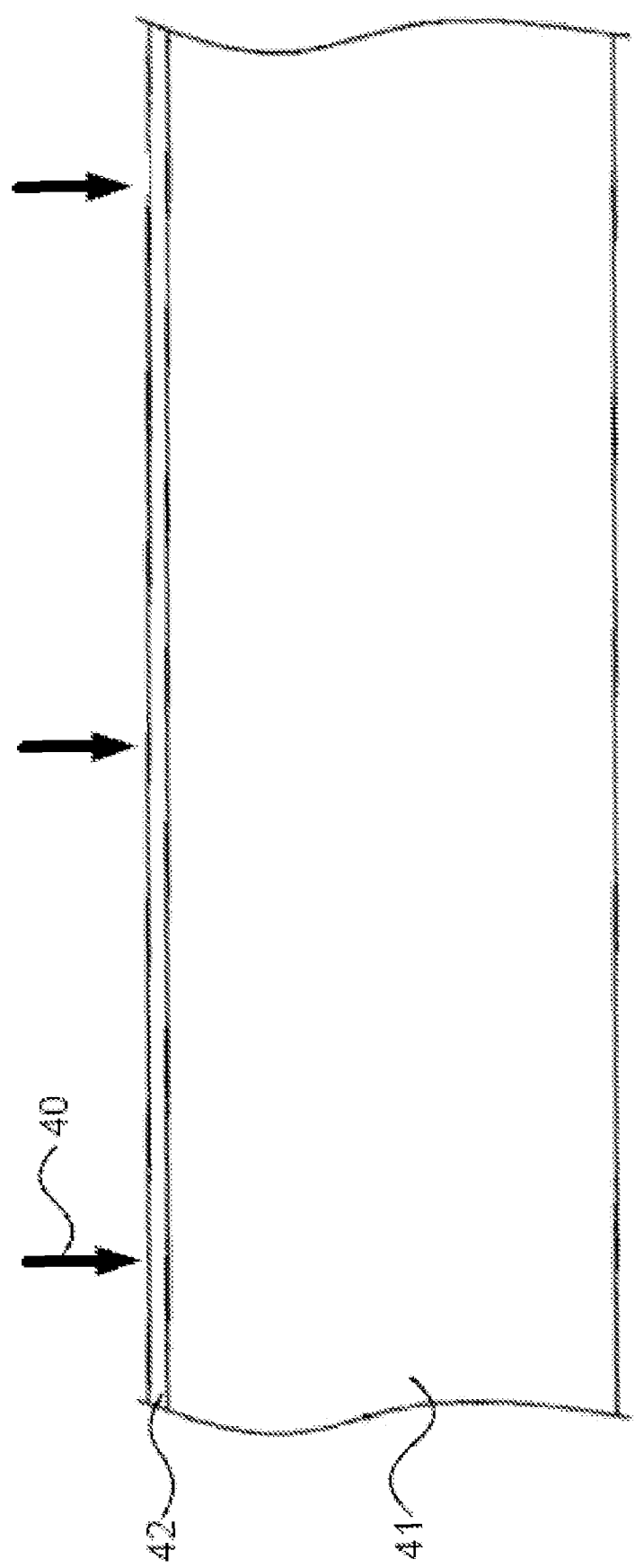
Figure 6C:
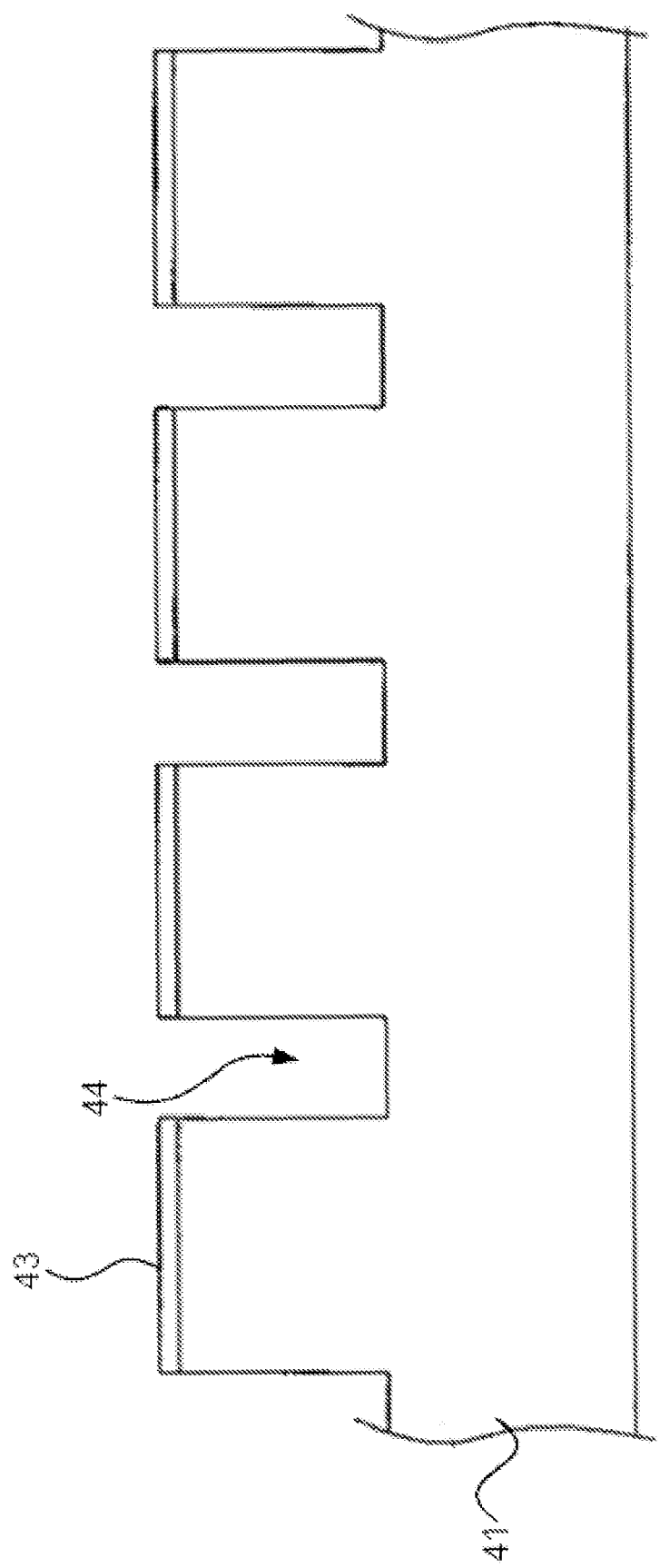

Please refer to FIG. 6A to FIG. 6F, which are views showing a flow and states of use of a second preferred embodiment. As shown in the figures, a second preferred embodiment according to the present disclosure uses a p-type silicon wafer as a substrate 41 for fabricating a selective emitter solar cell 4 with a front contact 45 precisely positioned at the heavily-doped region. In FIG. 6A, the second preferred embodiment comprises the following steps:

(a) Forming barrier pattern and trench 31: In FIG. 6B and FIG. 6C, the substrate 41 is nitrified with ammonia plasma 40 to form a silicon nitride layer 42. The silicon nitride layer 42 is patterned with a mask to form a barrier pattern 43 with an exposed region obtained on the substrate 41. Then, the substrate 41 is further removed to a certain depth from a surface of the exposed region to obtain trenches 44, which are not covered by the mask layer. Therein, the silicon nitride layer 42 is patterned to form the barrier pattern 43 through photolithography or screen printing with a paste, followed by an etching process. In the etching process, both silicon nitride and the silicon substrate 41 at the exposed region are etched to obtain the trenches 44. After etching, the mask layer for patterning the trenches is removed.

Figure 6D:
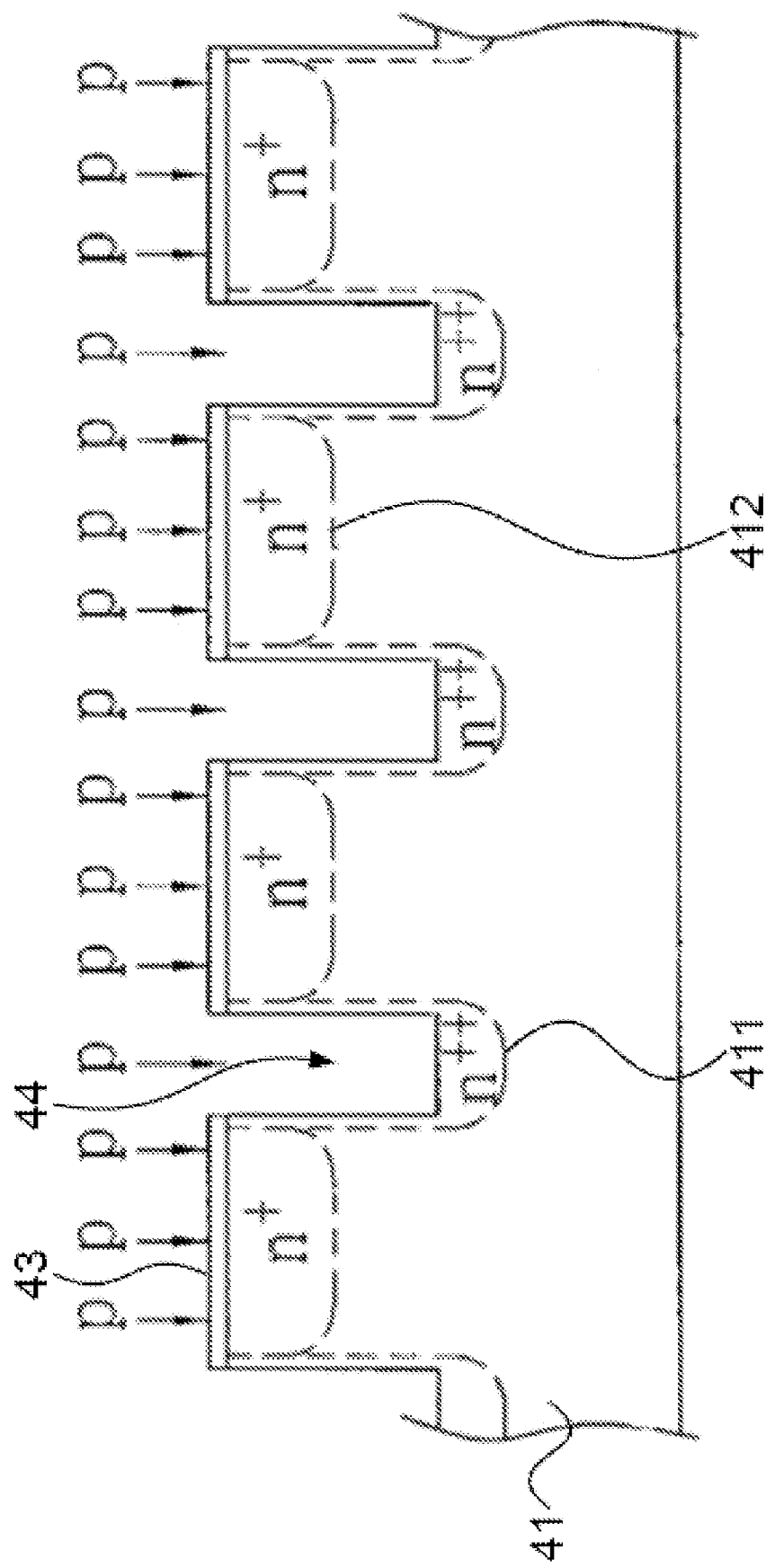
Figure 6E:
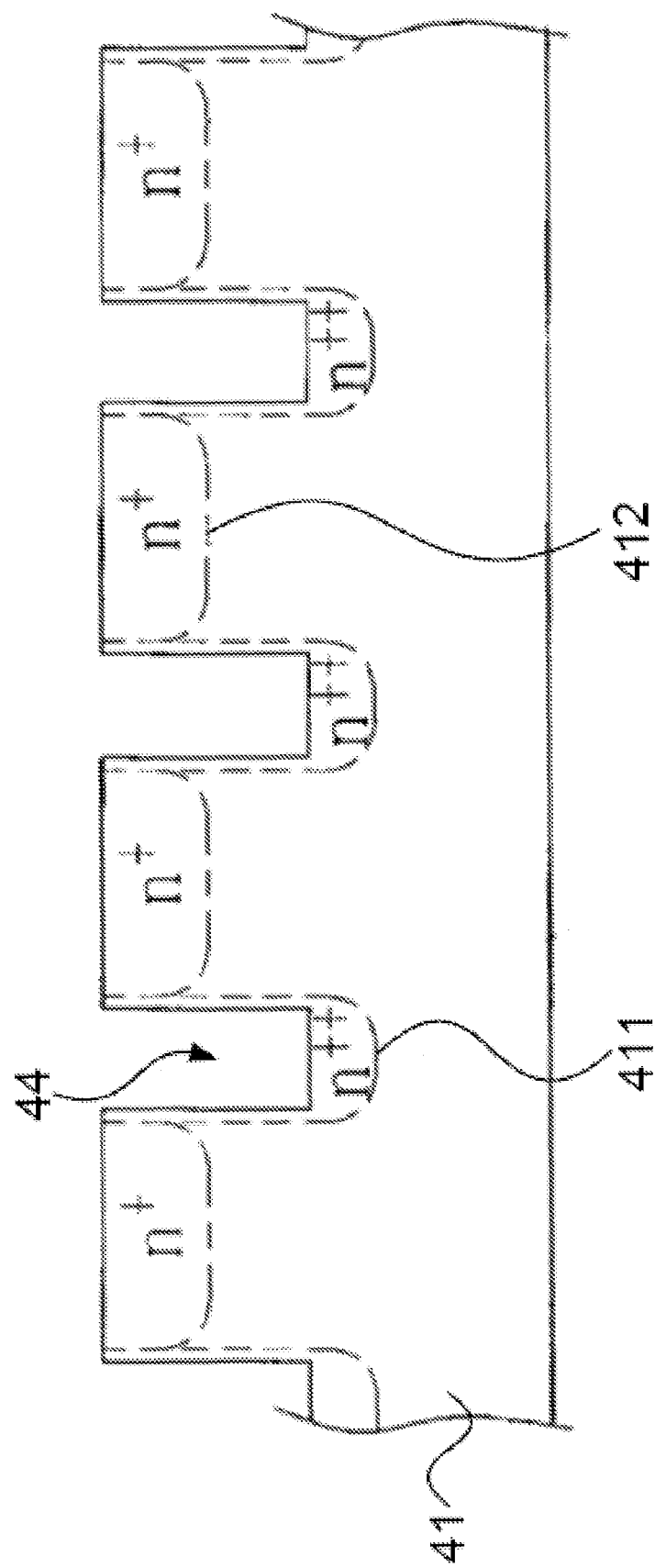
Figure 6F:
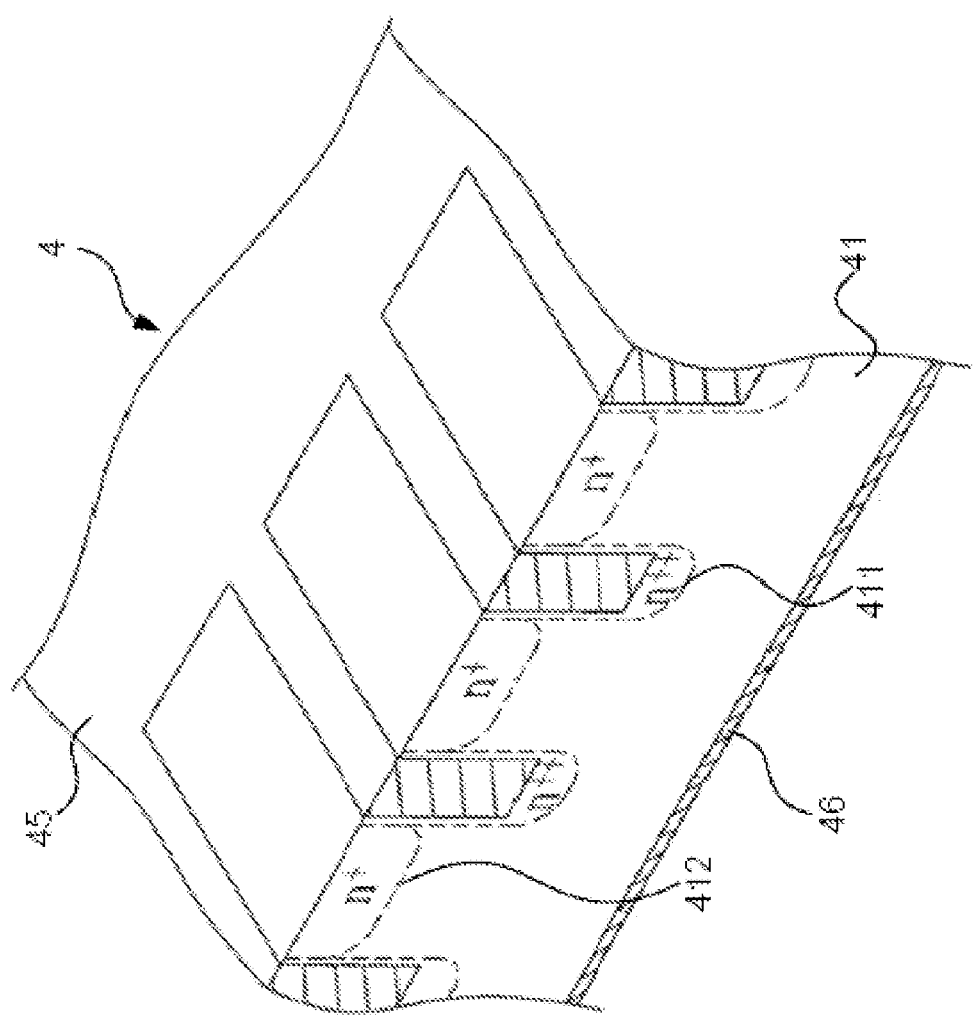
Figure 7:
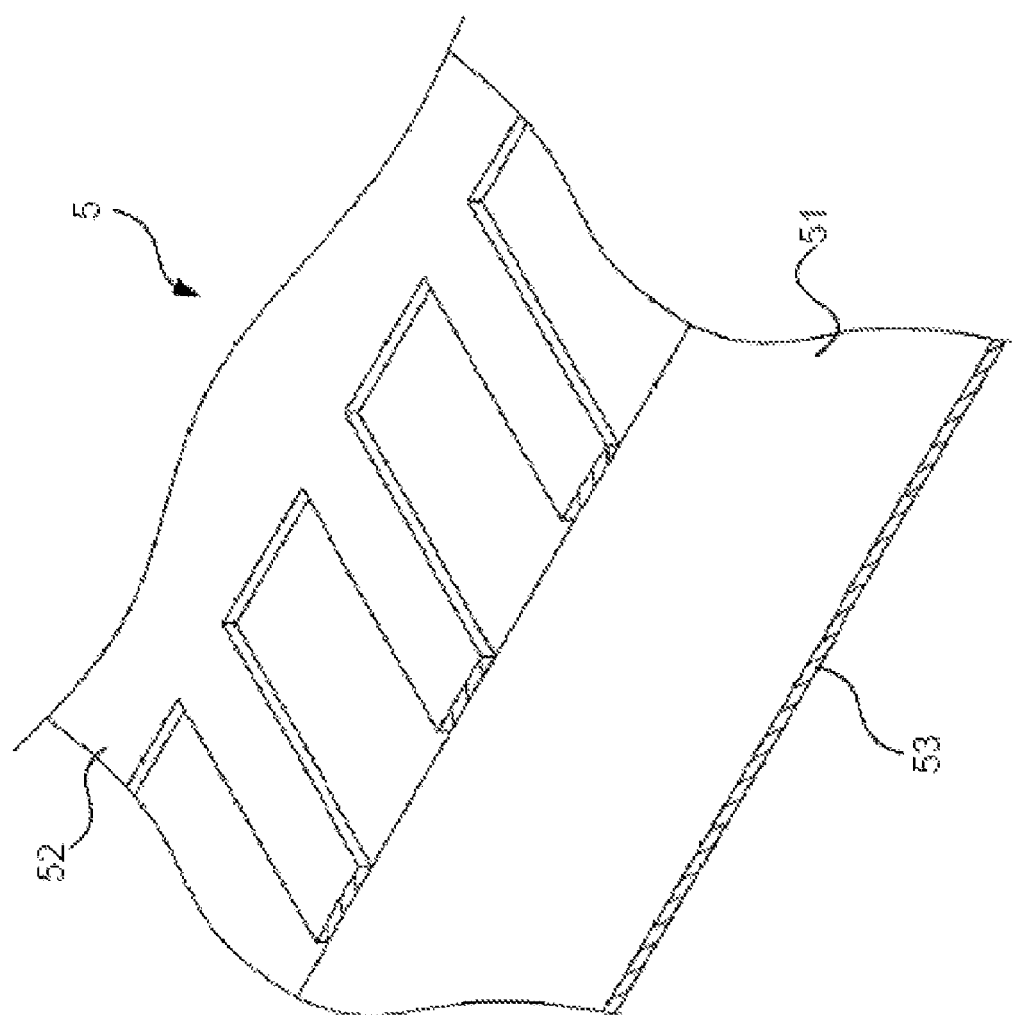
FIG. 7 is the view of the crystalline silicon solar cell as prior art.
Figure 8:
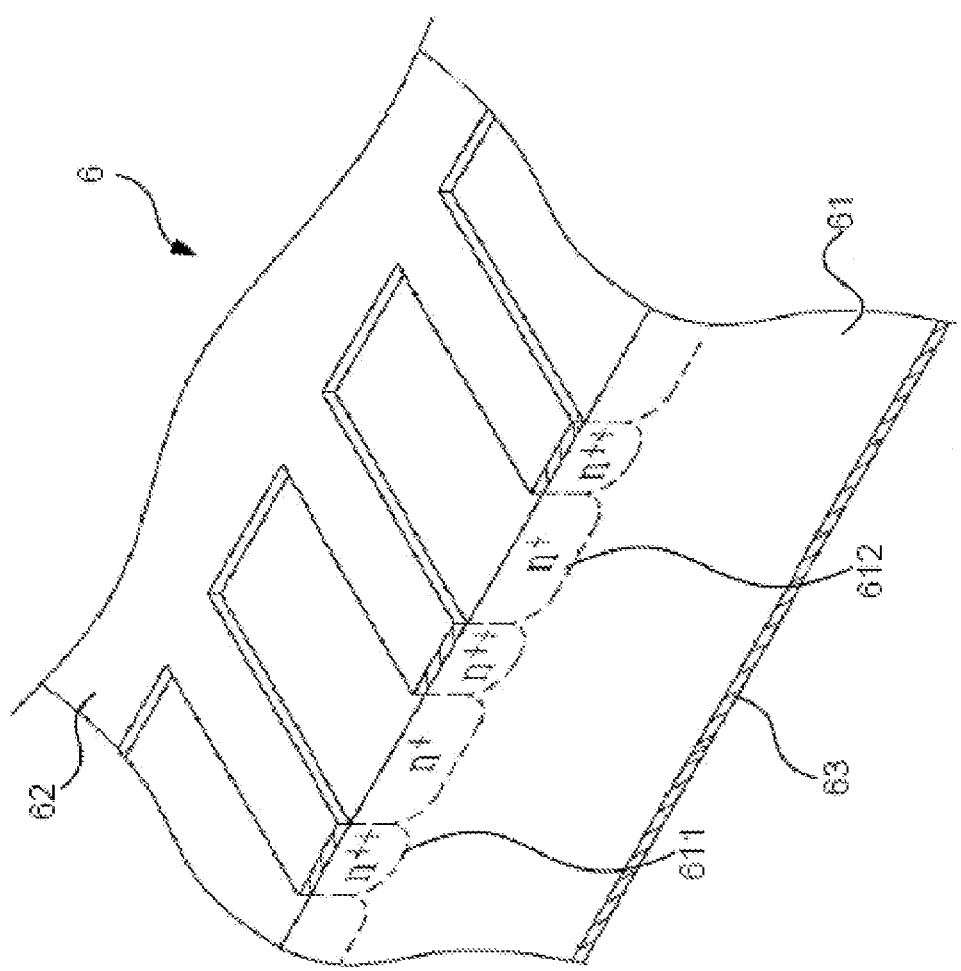
FIG. 8 is the view of the selective emitter solar cell as prior art.

(b) Forming lightly-doped region and heavily-doped region 32: In FIG. 6D, a dopant is doped into the substrate 41 through the barrier pattern 43 to form a lightly-doped region 412 having an n$^+$ doping type (with respect to the p-type substrate) in the substrate 41 at the region covered by the silicon nitride; and a heavily-doped region 411 having an n$^{++}$ doping type in the substrate 41 at the trench area not covered by the silicon nitride. Thus, a p-n junction is formed. Therein, $POCl_3$ and $O_2$ react at a high temperature between 700° C. and 1050° C. to obtain $P_2O_5$ as a dopant source for doping a dopant (i.e., phosphorus) into the substrate 41 to form the heavily-doped region 411 and the lightly-doped region 412.

(c) Removing barrier pattern 33: Then, in FIG. 6E, the barrier pattern 43 is removed.

(d) Forming front contact and back contact 34: Finally, in FIG. 6F, a conductive material is filled in the trenches 44 to form a front contact 45; and, a back contact 46 is formed at bottom of the substrate 41 electrically connected with the substrate 41 to output photocurrent with coordination of the front contact 45 when the selective emitter solar cell 4 is illuminated by light. Thus, a selective emitter solar cell 4 is fabricated. The present disclosure pastes a conductive layer made of a conductive material on the substrate 41 having the trenches 44 after removing the barrier pattern 43, where the conductive layer has to fill the trenches 44 and is preferred to fully cover the trenches 44 with an extra thickness of a few micrometers above the trenches. The thickness of the extra conductive layer, however, is preferred not to be more than 10 micrometers. Then, a chemical solution is used to remove the conductive layer outside the trenches 44 while the conductive material in the trench 44 remains for forming a front contact 45 within the trenches 44. Or, the front contact 45 can be formed by filling the conductive material in the trenches 44 through plating.

In the second preferred embodiment, a barrier pattern 43 and the trenches 44 are formed in accordance with said method. After forming lightly-doped region 412 and heavily-doped region 411, the front contact 45 is formed at the exact place without precise positioning as required by printing.

In the present disclosure, a textured top surface; an antireflection layer; or a passivation layer having surface passivation capability can be formed at an illuminated side of the substrate 41; or a back surface field can be formed at a back side of the substrate 41 (not shown in the figures).

To sum up, the present disclosure is a method of manufacturing a selective emitter solar cell, in which ammonia plasma is used for nitrification and for further forming a barrier pattern; a selective emitter is fabricated through one diffusion doping; and, trenches for filling conductive material to obtain a front contact are formed together with the barrier pattern at the same time to simplify the process and reduce the cost on fabricating a selective emitter solar cell.

The preferred embodiments herein disclosed are only for demonstration of the present disclosure, which do not intend to limit the scope of the disclosure. Therefore, simple modifications or variations belonging to the equivalent of the scope of the claims and the instructions disclosed herein for a patent are all within the scope of the present disclosure.

What is claimed is:

1. A method of manufacturing a selective emitter solar cell, the method comprising:

(a) obtaining a barrier pattern on a first surface of a substrate, wherein said barrier pattern is made of silicon nitride to obtain an exposed region of said substrate;

(b) doping a dopant from a dopant source into said substrate through said barrier pattern to obtain a lightly-doped region and a heavily-doped region, wherein said lightly-doped region has a doping type opposite to that of said substrate; and is obtained at a region covered by said silicon nitride and outside said exposed region of said substrate, wherein said heavily-doped region has a doping type opposite to that of said substrate; and is obtained at said exposed region of said substrate not covered by said silicon nitride, and wherein the doping concentration of said heavily-doped region is larger than that of said lightly-doped region and smaller than the solubility limit of said dopant in said substrate to obtain a p-n junction;

(c) removing said barrier pattern; and (d) obtaining a front contact electrically connected to said substrate at said heavily-doped region; and a back contact electrically connected to said substrate at a second surface of said substrate opposite to said first surface of said substrate, wherein photocurrent is outputted through coordination of said front contact and said back contact;

wherein, in step (a), said substrate contains silicon; a silicon nitride layer is obtained on said first surface of said substrate through nitrification;

wherein said silicon nitride layer is patterned to obtain said barrier pattern, wherein, in step (a), a region of said silicon nitride layer is removed to obtain an exposed region on said substrate and thus obtain said barrier pattern; and then, said substrate is further removed to a certain depth from a surface of said exposed region to obtain a plurality of trenches not covered by said silicon nitride;

wherein, in step (b) said dopant is doped into said substrate from said dopant source to form a heavily-doped region at the trench area and a lightly-doped region at the region covered by said silicon nitride; and wherein, in step (d), a conductive material is filled into said trenches to obtain said front contact.

2. The method according to claim 1, wherein, in step (a), said substrate is a p-type silicon wafer; said first surface of said substrate is nitrified to obtain said silicon nitride layer through using ammonia plasma; and said silicon nitride layer is made of $SiN_x$ with $0.2 \leq x \leq 5.0$ and is not thicker than 12 nm; and wherein, in step (b), said dopant is selected from a group consisting of P, As and Sb.

3. The method according to claim 2, wherein, in step (b), said dopant is doped into said substrate at a temperature between 700° C. and 1050° C.; and wherein, in step (c), an etchant which is able to etch said barrier pattern and said dopant source but is not able to etch said substrate is used to etch said barrier pattern and said dopant source at a time.

4. The method according to claim 3, wherein, in step (d), a layer of conductive material is coated on said substrate through a method selected from a group consisting of spraying and printing; and then, said conductive material which does not cover said trenches is removed while said conductive material in said trenches remains.

5. The method according to claim 3, wherein step (d) runs before step (c) such that said trenches are filled with said conductive material at first; and wherein said barrier pattern is removed afterwards to obtain said front contact.

6. The method according to claim 1, wherein, in step (a), said substrate is an n-type silicon wafer; said first surface of said substrate is nitrified to obtain said silicon nitride layer through using ammonia plasma; and said silicon nitride layer is made of $SiN_x$ with $0.2 \leq x \leq 5.0$ and is not thicker than 12 nm; and wherein, in step (b), said dopant is selected from a group consisting of B, Al, Ga, In and Tl.

7. The method according to claim 6, wherein, in step (b), said dopant is doped into said substrate at a temperature between 650° C. and 1050° C.; and wherein, in step (c), an etchant which is able to etch said barrier pattern and said dopant source but is not able to etch said substrate is used to etch said barrier pattern and said dopant source at a time.

8. The method according to claim 7, wherein, in step (d), a layer of conductive material is coated on said substrate through a method selected from a group consisting of spraying and printing; and wherein said conductive material which does not cover said trenches is removed while said conductive material in said trenches remains.

9. The method according to claim 7, wherein step (d) runs before step (c) such that said trenches are filled with said conductive material at first; and wherein said barrier pattern is removed afterwards to obtain said front contact.

10. A method of manufacturing a selective emitter solar cell, the method comprising:

(a) obtaining a barrier pattern on a first surface of a substrate, wherein said barrier pattern is made of silicon nitride to obtain an exposed region of said substrate;

(b) doping a dopant from a dopant source into said substrate through said barrier pattern to obtain a lightly-doped region and a heavily-doped region, wherein said lightly-doped region has a doping type opposite to that of said substrate; and is obtained at a region covered by said silicon nitride and outside said exposed region of said substrate, wherein said heavily-doped region has a doping type opposite to that of said substrate; and is obtained at said exposed region of said substrate not covered by said silicon nitride, and wherein the doping concentration of said heavily-doped region is larger than that of said lightly-doped region and smaller than the solubility limit of said dopant in said substrate to obtain a p-n junction;

(c) removing said barrier pattern; and (d) obtaining a front contact electrically connected to said substrate at said heavily-doped region; and a back contact electrically connected to said substrate at a second surface of said substrate opposite to said first surface of said substrate, wherein photocurrent is outputted through coordination of said front contact and said back contact;

wherein, in step (a), said substrate contains silicon; a mask layer is coated on said first surface of said substrate and, after patterned, said mask layer exhibits an exposed region of said substrate that is not covered by said mask layer; through nitrification, silicon nitride is obtained on said exposed region not covered by said mask layer; and then, said mask layer is removed to obtain a barrier pattern made of said silicon nitride;

wherein, in step (b), said dopant is doped into said substrate from said dopant source;

wherein, in step (c), said barrier pattern is removed; and wherein, in step (d), said front contact and said back contact are obtained, wherein, in step (a), said substrate is further removed to a certain depth from a surface of a region not covered by said silicon nitride to obtain a plurality of trenches;

wherein, in step (b) said dopant is doped into said substrate from said dopant source to form a heavily-doped region at the trench area and a lightly-doped region at the region covered by said silicon nitride; and wherein, in step (d), a conductive material is filled into said trenches to obtain said front contact.

11. The method according to claim 10, wherein, in step (a), said substrate is a p-type silicon wafer; said first surface of said substrate is nitrified to obtain said barrier pattern of silicon nitride through using ammonia plasma; and said silicon nitride is made of $SiN_x$ with $0.2 \leq x \leq 5.0$ and is not thicker than 12 nm; and wherein, in step (b), said dopant is selected from a group consisting of P, As and Sb.

12. The method according to claim 11, wherein, in step (b), said dopant is doped into said substrate at a temperature between 700° C. and 1050° C.; and wherein, in step (c), an etchant which is able to etch said barrier pattern and said dopant source but is not able to etch said substrate is used to etch said barrier pattern and said dopant source at a time.

13. The method according to claim 12, wherein, in step (d), a layer of conductive material is coated on said substrate through a method selected from a group consisting of spraying and printing; and wherein said conductive material which does not cover said trenches is removed while said conductive material in said trenches remains.

14. The method according to claim 12, wherein step (d) runs before step (c) such that said trenches are filled with said conductive material at first; and wherein said barrier pattern is removed afterwards to obtain said front contact.

15. The method according to claim 10, wherein, in step (a), said substrate is an n-type silicon wafer; said first surface of said substrate is nitrified to obtain said barrier pattern of silicon nitride through using ammonia plasma; and said silicon nitride is made of $SiN_x$ with $0.2 \leq x \leq 5.0$ and is not thicker than 12 nm; and wherein, in step (b), said dopant is selected from a group consisting of B, Al, Ga, In and Tl.

16. The method according to claim 15, wherein, in step (b), said dopant is doped into said substrate at a temperature between 650° C. and 1050° C.; and wherein, in step (c), an etchant which is able to etch said barrier pattern and said dopant source but is not able to etch said substrate is used to etch said barrier pattern and said dopant source at a time.

17. The method according to claim 16, wherein, in step (d), a layer of conductive material is coated on said substrate through a method selected from a group consisting of spraying and printing; and wherein said conductive material which does not cover said trenches is removed while said conductive material in said trenches remains.

18. The method according to claim 16, wherein step (d) runs before step (c) such that said trenches are filled with said conductive material at first; and wherein said barrier pattern is removed afterwards to obtain said front contact.

19. A method of manufacturing a selective emitter solar cell, the method comprising:

(a) obtaining a barrier pattern on a first surface of a substrate, wherein said barrier pattern is made of silicon nitride to obtain an exposed region of said substrate;

(b) doping a dopant from a dopant source into said substrate through said barrier pattern to obtain a lightly-doped region and a heavily-doped region, wherein said lightly-doped region has a doping type opposite to that of said substrate; and is obtained at a region covered by said silicon nitride and outside said exposed region of said substrate, wherein said heavily-doped region has a doping type opposite to that of said substrate; and is obtained at said exposed region of said substrate not covered by said silicon nitride, and wherein the doping concentration of said heavily-doped region is larger than that of said lightly-doped region and smaller than the solubility limit of said dopant in said substrate to obtain a p-n junction;

(c) removing said barrier pattern; and (d) obtaining a front contact electrically connected to said substrate at said heavily-doped region; and a back contact electrically connected to said substrate at a second surface of said substrate opposite to said first surface of said substrate, wherein photocurrent is outputted through coordination of said front contact and said back contact, wherein, in step (a), said barrier pattern made of silicon nitride is obtained on said substrate through a method selected from a group consisting of chemical vapor deposition, sputtering, evaporating and chemical wet process;

wherein said silicon nitride is made of SiNx with $0.2 \leq x \leq 5.0$ and is not thicker than 12 nm;

wherein, after obtaining said barrier pattern, said substrate is further removed to a certain depth from a surface of said exposed region to obtain a plurality of trenches not covered by said silicon nitride;

wherein, in step (b) said dopant is doped into said substrate from said dopant source to form a heavily-doped region at the trench area and a lightly-doped region at the region covered by said silicon nitride; and wherein, in step (d), a conductive material is filled into said trenches to obtain said front contact.

20. The method according to claim 19, wherein, in step (a), said substrate is a p-type silicon wafer; and wherein, in step (b), said dopant is selected from a group consisting of P, As and Sb.

21. The method according to claim 20, wherein, in step (b), said dopant is doped into said substrate at a temperature between 700° C. and 1050° C.; and wherein, in step (c), an etchant which is able to etch said barrier pattern and said dopant source but is not able to etch said substrate is used to etch said barrier pattern and said dopant source at a time.

22. The method according to claim 21,
wherein, in step (d), a layer of conductive material is coated on said substrate through a method selected from a group consisting of spraying and printing; and
wherein said conductive material which does not cover said trenches is removed while said conductive material in said trenches remains.

23. The method according to claim 21,
wherein step (d) runs before step (c) such that said trenches are filled with said conductive material at first; and
wherein said barrier pattern is removed afterwards to obtain said front contact.

24. The method according to claim 19,
wherein, in step (a), said substrate is an n-type silicon wafer; and
wherein, in step (b), said dopant is selected from a group consisting of B, Al, Ga, In and Tl.

25. The method according to claim 24,
wherein, in step (b), said dopant is doped into said substrate at a temperature between 650° C. and 1050° C.; and
wherein, in step (c), an etchant which is able to etch said barrier pattern and said dopant source but is not able to etch said substrate is used to etch said barrier pattern and said dopant source at a time.

26. The method according to claim 25,
wherein, in step (d), a layer of conductive material is coated on said substrate through a method selected from a group consisting of spraying and printing; and
wherein said conductive material which does not cover said trenches is removed while said conductive material in said trenches remains.

27. The method according to claim 25,
wherein step (d) runs before step (c) such that said trenches are filled with said conductive material at first; and
wherein said barrier pattern is removed afterwards to obtain said front contact.

* * * * *